(12) United States Patent
Mao et al.

(10) Patent No.: US 12,009,357 B2
(45) Date of Patent: Jun. 11, 2024

(54) DIODE-TRIGGERED BIDIRECTIONAL SILICON CONTROLLED RECTIFIER AND CIRCUIT

(71) Applicant: CHANGXIN MEMORY TECHNOLOGIES, INC., Hefei (CN)

(72) Inventors: Pan Mao, Hefei (CN); Yingtao Zhang, Hefei (CN); Junjie Liu, Hefei (CN); Lingxin Zhu, Hefei (CN); Bin Song, Hefei (CN); Qian Xu, Hefei (CN); Tieh-Chiang Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 488 days.

(21) Appl. No.: 17/451,173

(22) Filed: Oct. 18, 2021

(65) Prior Publication Data

US 2023/0022588 A1    Jan. 26, 2023

Related U.S. Application Data

(63) Continuation of application No. PCT/CN2021/109982, filed on Aug. 2, 2021.

(30) Foreign Application Priority Data

Jul. 22, 2021   (CN) .......................... 202110833144.5

(51) Int. Cl.
   *H01L 27/02* (2006.01)
   *H01L 29/747* (2006.01)
   *H01L 29/87* (2006.01)

(52) U.S. Cl.
   CPC ........ *H01L 27/0248* (2013.01); *H01L 29/747* (2013.01); *H01L 29/87* (2013.01)

(58) Field of Classification Search
   CPC .............. H01L 27/0248; H01L 29/747; H01L 27/0262; H01L 29/87; H01L 27/0255; H01L 29/861
   See application file for complete search history.

(56) References Cited

U.S. PATENT DOCUMENTS

| | | | |
|---|---|---|---|
| 10,157,925 B1 | 12/2018 | Kuo et al. | |
| 2013/0087830 A1* | 4/2013 | Gauthier, Jr. | H01L 29/7436 257/173 |
| 2022/0208751 A1* | 6/2022 | Chang | H01L 27/0255 |

FOREIGN PATENT DOCUMENTS

| | | |
|---|---|---|
| CN | 105633074 A | 6/2016 |
| CN | 107546223 A | 1/2018 |

(Continued)

OTHER PUBLICATIONS

International Search Report cited in PCT/CN2021/109982, mailed Apr. 19, 2022, 8 pages.

*Primary Examiner* — Wasiul Haider
(74) *Attorney, Agent, or Firm* — Cooper Legal Group, LLC

(57) ABSTRACT

The present disclosure provides a diode-triggered bidirectional silicon controlled rectifier and circuit. The silicon controlled rectifier includes: a P-type substrate; a first P well formed in the P-type substrate, a first P-type doped region and a first N-type doped region being formed in the first P well; a second P well formed in the P-type substrate, a third N-type doped region and a fourth P-type doped region being formed in the second P well; and an N well formed in the P-type substrate, a second P-type doped region, a second N-type doped region and a third P-type doped region being formed in the N well. The second N-type doped region is electrically connected with a positive electrode of a diode string, and the first P-type doped region and the fourth (Continued)

P-type doped region are electrically connected with a negative electrode of the diode string.

20 Claims, 3 Drawing Sheets

(56) References Cited

FOREIGN PATENT DOCUMENTS

| | | | |
|---|---|---|---|
| CN | 109659232 A | 4/2019 | |
| CN | 110335866 A | 10/2019 | |
| CN | 112530935 A | 3/2021 | |
| CN | 112563262 A | 3/2021 | |

* cited by examiner

DIODE-TRIGGERED BIDIRECTIONAL SILICON CONTROLLED RECTIFIER AND CIRCUIT

CROSS-REFERENCE TO RELATED DISCLOSURES

This disclosure is a continuation of International Patent Application No. PCT/CN2021/109982, filed on Aug. 2, 2021, which claims priority to Chinese Patent Application No. 202110833144.5, filed with the Chinese Patent Office on Jul. 22, 2021 and entitled "DIODE-TRIGGERED BIDIRECTIONAL SILICON CONTROLLED RECTIFIER AND CIRCUIT." International Patent Application No. PCT/CN2021/109982 and Chinese Patent Application No. 202110833144.5 are incorporated herein by reference in their entireties.

TECHNICAL FIELD

The present disclosure belongs to the field of integrated circuit electro-static discharge protection technologies, and in particular relates to a bidirectional silicon controlled rectifier and circuit for low-voltage bidirectional electro-static discharge (ESD) protection.

BACKGROUND

In ESD protection, the following basic characteristics are required: high sensitivity, high robustness, low on-resistance, low leakage current, and low capacitance. Thus, diodes, metal-oxide-semiconductor field-effect transistors (MOS), bipolar transistors, silicon controlled rectifiers (SCR) or the like are typically employed. SCR has received extensive attention from ESD researchers due to its advantages such as high robustness, small leakage current or the like. In general, the SCR device is a unidirectional ESD protection device, and ESD protection in the other direction is accomplished by a parasitic diode or a parallel diode. Use of an additional diode for ESD protection in the other direction will increase the layout area. In some circuits with input ports that need to withstand negative voltages, if the anode voltage is lower than −0.7V and the cathode voltage is 0V, then when a diode is used for protection in the reverse direction, the diode will be turned on during normal operation and cause current leakage. In this case, a bidirectional SCR structure must be utilized for protection.

SUMMARY

The present disclosure provides a diode-triggered bidirectional silicon controlled rectifier and circuit, achieving adjustable bidirectional trigger voltages and saving the layout area through the common connection with diodes.

A first aspect of the embodiments of the present disclosure provides a diode-triggered bidirectional silicon controlled rectifier, which includes a silicon controlled rectifier and a diode string. The silicon controlled rectifier has an anode and a cathode, and includes:
  a P-type substrate;
  a first P well formed in the P-type substrate, a first P-type doped region and a first N-type doped region being formed in the first P well;
  a second P well formed in the P-type substrate, a third N-type doped region and a fourth P-type doped region being formed in the second P well; and
  an N well formed in the P-type substrate, a second P-type doped region, a second N-type doped region and a third P-type doped region being formed in the N well;
  wherein the first N-type doped region and the third P-type doped region are electrically connected with the anode; the third N-type doped region and the second P-type doped region are electrically connected with the cathode; the second N-type doped region is electrically connected with a positive electrode of the diode string, and the first P-type doped region and the fourth P-type doped region are electrically connected with a negative electrode of the diode string.

A second aspect of the embodiments of the present disclosure provides a diode-triggered circuit, which includes:
  a forward diode trigger circuit, the forward diode trigger circuit including a first diode, a diode string and a second diode;
  a reverse diode trigger circuit, the reverse diode trigger circuit including a third diode, a diode string and a fourth diode;
  a forward SCR loop, the forward SCR loop including a first PNP bipolar transistor and a first NPN bipolar transistor; and
  a reverse SCR loop, the reverse SCR loop including a second PNP bipolar transistor and a second NPN bipolar transistor;
  wherein the forward diode trigger circuit and the reverse diode trigger circuit share the diode string.

Figure 1:
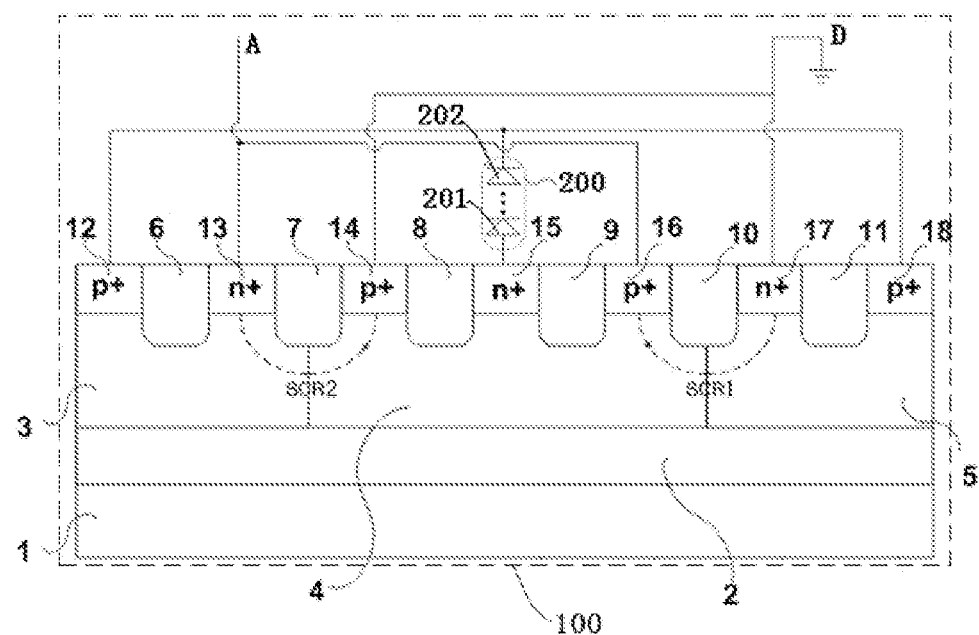
FIG. 1 is a schematic structural diagram of the bidirectional silicon controlled rectifier according to an embodiment of the present disclosure.

REFERENCE NUMERALS 100 silicon controlled rectifier;
1 P-type substrate;
2 deep N well;
3 first P well;
4 N well;
5 second P well;
6 first trench;
7 second trench;
8 third trench;
9 fourth trench;
10 fifth trench;
11 sixth trench;
12 first P-type doped region;
13 first N-type doped region;
14 second P-type doped region;
15 second N-type doped region;
16 third P-type doped region;
17 third N-type doped region;

18 fourth P-type doped region;
200 diode string;
101 first PNP bipolar transistor;
102 second PNP bipolar transistor;
103 first NPN bipolar transistor;
104 second NPN bipolar transistor;
105 first diode;
106 second diode;
107 third diode;
108 fourth diode;
201 fifth diode;
202 sixth diode.

DESCRIPTION OF EMBODIMENTS

The exemplary embodiments will now be described more fully with reference to the accompanying drawings. However, the exemplary embodiments can be implemented in a variety of forms and should not be construed as limited to the embodiments set forth herein. Rather, these embodiments are provided so that the present disclosure will be thorough and complete and will fully convey the concepts of the exemplary embodiments to those skilled in the art. The described features, structures or characteristics may be combined in one or more embodiments in any suitable manner. In the following description, many specific details are provided to give a sufficient understanding of the embodiments of the present disclosure.

The described features, structures or characteristics may be combined in one or more embodiments in any suitable manner. In the following description, many specific details are provided to give a sufficient understanding of the embodiments of the present disclosure. However, those skilled in the art will realize that the technical solution of the present disclosure can be practiced without one or more of the specific details, or other methods, components, materials, etc. can be used. In other cases, well-known structures, materials or operations are not shown or described in detail to avoid obscuring the main technical idea of the present disclosure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc. The terms "first" and "second" are used as markers only, and are not intended to limit the number of their objects.

In general, the SCR device is a unidirectional ESD protection device, and ESD protection in the other direction is accomplished by a parasitic diode or a parallel diode. Use of an additional diode for ESD protection in the other direction will increase the layout area. In some circuits with input ports that need to withstand negative voltages, if the anode voltage is lower than −0.7V and the cathode voltage is 0V, then when a diode is used for protection in the reverse direction, the diode will be turned on during normal operation and cause current leakage. In this case, a bidirectional SCR structure must be utilized for protection.

Through the common connection with diodes, adjustable bidirectional trigger voltages can be achieved and the layout area can be saved.

As shown in FIG. 1, a diode-triggered bidirectional silicon controlled rectifier includes a silicon controlled rectifier 100 and a diode string 200, the silicon controlled rectifier 100 has an anode A and a cathode D, and includes:

a P-type substrate 1;
a first P well 3 formed in the P-type substrate, a first P-type doped region 12 and a first N-type doped region 13 being formed in the first P well 3;
a second P well 5 formed in the P-type substrate 1, a third N-type doped region 17 and a fourth P-type doped region 18 being formed in the second P well 5; and
an N well 4 formed in the P-type substrate 1, a second P-type doped region 14, a second N-type doped region 15 and a third P-type doped region 16 being formed in the N well 4;
wherein the first N-type doped region 13 and the third P-type doped region 16 are electrically connected with the anode A; the third N-type doped region 17 and the second P-type doped region 14 are electrically connected with the cathode D; the second N-type doped region 15 is electrically connected with a positive electrode of the diode string 200, and the first P-type doped region 12 and the fourth P-type doped region 18 are electrically connected with a negative electrode of the diode string 200.

In particular, the third P-type doped region 16 and the N well 4 are equivalent to a first diode 105, the third N-type doped region 17 and the second P well 5 are equivalent to a second diode 106, the second P-type doped region 14 and the N well 4 are equivalent to a third diode 107, and the first N-type doped region 13 and the first P well 3 are equivalent to a fourth diode 108. The third P-type doped region 16, the N well 4, the second P well 5 and the third N-type doped region 17 are equivalent to a first PNP bipolar transistor 101, the N well 4, the second P well 5 and the third N-type doped region 17 are equivalent to a first NPN bipolar transistor 103, the second P-type doped region 14, the N well 4 and the first P well 3 are equivalent to a second PNP bipolar transistor 102, and the N well 4, the first P well 3 and the first N-type doped region 13 are equivalent to a second NPN bipolar transistor 104.

Figure 2:
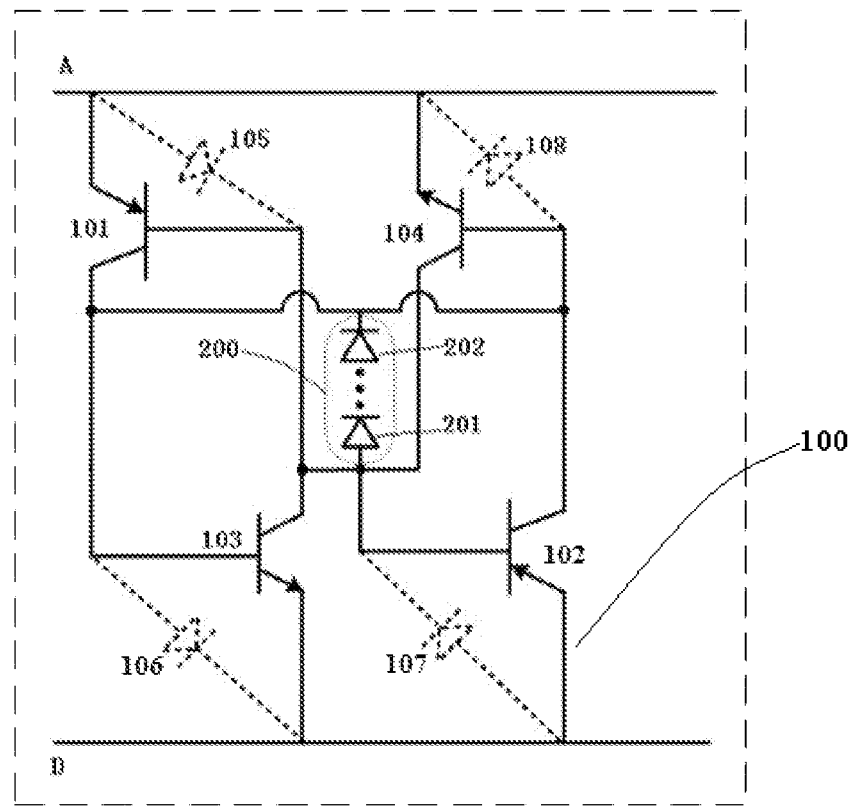
FIG. 2 is an equivalent circuit diagram of the bidirectional silicon controlled rectifier according to an embodiment of the present disclosure.

An equivalent circuit diagram of the diode-triggered bidirectional silicon controlled rectifier is as shown in FIG. 2. The positive electrode of the diode string 200 is connected with the negative electrode of the first diode 105, the negative electrode of the third diode 107, the base of the first PNP bipolar transistor 101, the base of the second PNP bipolar transistor 102, the collector of the first NPN bipolar transistor 103 and the collector of the second NPN bipolar transistor 104. The negative electrode of the diode string 200 is connected with the positive electrode of the second diode 106, the positive electrode of the fourth diode 108, the collector of the first PNP bipolar transistor 101, the collector of the second PNP bipolar transistor 102, the base of the first NPN bipolar transistor 103 and the base of the second NPN bipolar transistor 104. The positive electrode of the first diode 105, the negative electrode of the fourth diode 108, the emitter of the first PNP bipolar transistor 101 and the emitter of the second NPN bipolar transistor 104 are connected with the anode A of the silicon controlled rectifier. The negative electrode of the second diode 106, the positive electrode of the third diode 107, the emitter of the first NPN bipolar transistor 103 and the emitter of the second PNP bipolar transistor 102 are connected with the cathode D of the silicon controlled rectifier.

The first PNP bipolar transistor 101 and the first NPN bipolar transistor 103 constitute a forward SCR loop. The second PNP bipolar transistor 102 and the second NPN bipolar transistor 104 constitute a reverse SCR loop. The first diode 105, the diode string 200 and the second diode 106 constitute a forward diode trigger circuit. The third diode 107, the diode string 200 and the fourth diode 108 constitute a reverse diode trigger circuit.

In the present embodiment, the forward diode trigger circuit and the reverse diode trigger circuit share the external diode string 200. Through the common connection with diodes, adjustable bidirectional trigger voltages can be achieved and the layout area can be saved.

The operating principal of the bidirectional silicon controlled rectifier is as follows.

In a case where the anode A experiences an ESD discharge event, the voltage of the anode A rises rapidly, the forward diode trigger path is turned on to form a trigger current, a PN junction composed of the base and emitter of the first PNP bipolar transistor 101 is forward-biased and turned on, and meanwhile the collector current of the first PNP bipolar transistor 101 is the base current of the first NPN bipolar transistor 103. As a result, the first NPN bipolar transistor 103 is turned on, while the collector current of the first NPN bipolar transistor 103 is the base current of the first PNP bipolar transistor 101. Therefore, the first NPN bipolar transistor 103 and the first PNP bipolar transistor 101 create a positive feedback, thereby generating a low-resistance ESD discharge path.

In a case where the cathode D experiences the ESD discharge event, the voltage of the cathode D rises rapidly, the reverse diode trigger path is turned on to form a trigger current, a PN junction composed of the base and emitter of the second PNP bipolar transistor 102 is forward-biased and turned on, and meanwhile the collector current of the second PNP bipolar transistor 102 is the base current of the second NPN bipolar transistor 104. As a result, the second NPN bipolar transistor 104 is turned on, while the collector current of the second NPN bipolar transistor 104 is the base current of the second PNP bipolar transistor 102. Therefore, the second NPN bipolar transistor 104 and the second PNP bipolar transistor 102 create a positive feedback, thereby generating a low-resistance ESD discharge path.

To prove the effect of the bidirectional silicon controlled rectifier of the present embodiment, verification is carried out below by means of simulation experiments.

Figure 3:
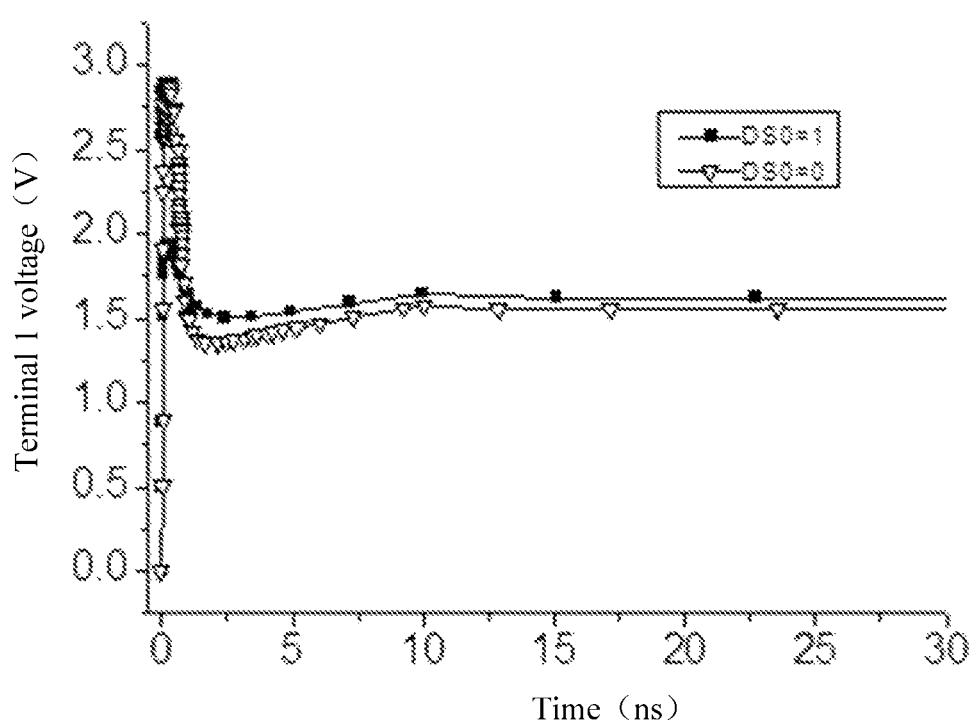
FIG. 3 is a first diagram showing simulation results of a forward TLP test for the bidirectional silicon controlled rectifier according to an embodiment of the present disclosure.

FIG. 3 is a first diagram showing simulation results of a forward TLP test for the bidirectional silicon controlled rectifier according to an embodiment of the present disclosure.

In particular, two curves represent simulation curves fort) and 1 external diode string 200, respectively. Referring to FIG. 3, in the TLP test, the situation where a forward ESD discharge event occurs in a protective circuit is simulated under a state that the current of the anode A rises from 0 A to 1.32 A within 10 nanoseconds and then lasts for 100 nanoseconds, and the output is a forward overshoot voltage when the silicon controlled circuit is turned on. As can be seen, the overshoot voltages in these two situations are 1.9 V and 2.8 V, respectively, and the proper structure may be selected depending on the specific protection window.

Figure 4:
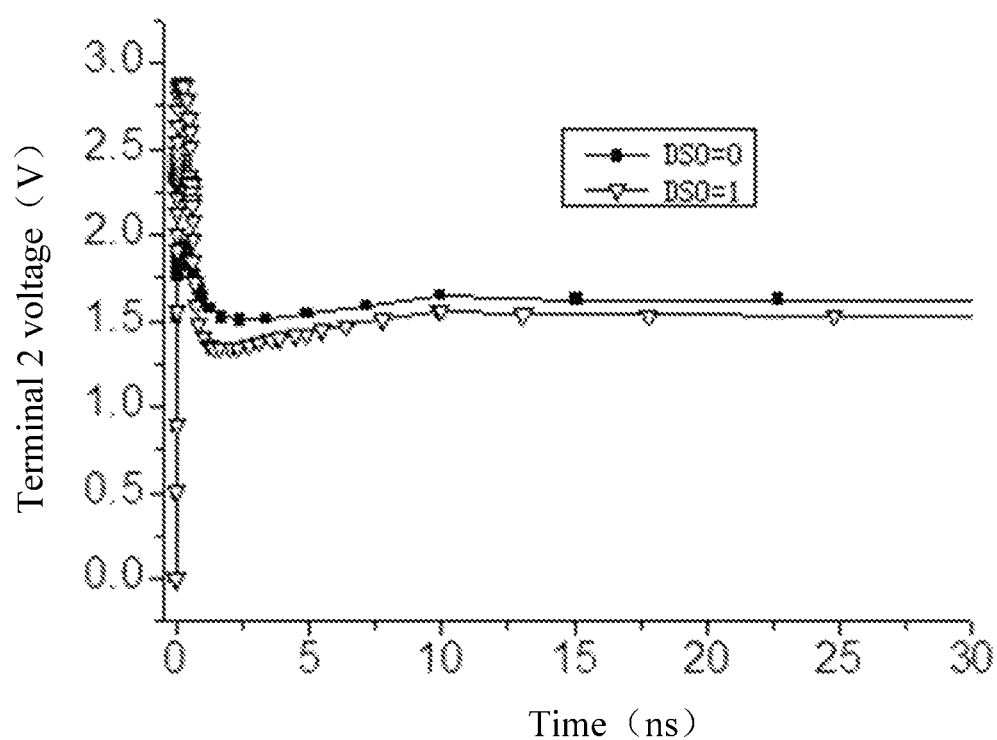
FIG. 4 is a second diagram showing simulation results of a reverse TLP test for the bidirectional silicon controlled rectifier according to an embodiment of the present disclosure.

FIG. 4 is a second diagram showing simulation results of a reverse TLP test for the bidirectional silicon controlled rectifier according to an embodiment of the present disclosure.

In particular, two curves represent simulation curves fort) and 1 external diode string 200, respectively. Referring to FIG. 4, in the TLP test, the situation where a reverse ESD discharge event occurs in the protective circuit is simulated under a state that the current of the cathode D rises from 0 A to 1.32 A within 10 nanoseconds and then lasts for 100 nanoseconds, and the output is a reverse overshoot voltage when the silicon controlled circuit is turned on. As can be seen, the overshoot voltages in these two situations are 1.9 V and 2.8 V, respectively, which are fully symmetrical with those in the forward situations.

In some embodiments, the first P-type doped region 12, the second P-type doped region 14, the third P-type doped region 16, the fourth P-type doped region 18, the first N-type doped region 13, the second N-type doped region 15 and the third N-type doped region 17 are all heavily doped regions, and the first P well 3, the second P well 5 and the N well 4 are all lightly doped regions.

In some embodiments, the first P well 3 and the second P well 5 are closely adjacent to the N well 4, and the first P well 3 and the second P well 5 are distributed symmetrically with respect to a central axis of the N well 4; wherein the first P-type doped region 12 and the fourth P-type doped region 18 are symmetrical with respect to the central axis of the N well 4, the first N-type doped region 13 and the third N-type doped region 17 are symmetrical with respect to the central axis of the N well 4, and the second P-type doped region 14 and the third P-type doped region 16 are symmetrical with respect to the central axis of the N well 4.

In the present embodiment, the wells and doped regions of the silicon controlled rectifier 100 are all distributed symmetrically, the forward SCR loop SCR1 and the reverse SCR loop SCR2 are physically overlapped, and the ports of an integrated circuit can operate on the forward SCR loop or the reverse SCR loop. Moreover, the entire device structure is distributed axially symmetrically with respect to the center line, resulting in a more compact physical layout.

In some embodiments, as seen in a direction from the first P well 3 towards the second P well 5 via the N well 4, the doped regions are the first P-type doped region 12, the first N-type doped region 13, the second P-type doped region 14, the second N-type doped region 15, the third P-type doped region 16, the third N-type doped region 17, and the fourth P-type doped region 18 in sequence.

In some embodiments, a deep N well 42 is formed in the substrate, and the first P well 3, the N well 4 and the second P well 5 are disposed on an upper surface of the deep N well 2.

In some embodiments, shallow trench isolation structures are formed between adjacent doped regions, with the depths of the doped regions being less than the depths of the shallow trench isolation structures.

In particular, a first trench 6 is provided between the first P-type doped region 12 and the first N-type doped region 13, a second trench 7 is provided between the first N-type doped region 13 and the second P-type doped region 14, a third trench 8 is provided between the second P-type doped region 14 and the second N-type doped region 15, a fourth trench 9 is provided between the second N-type doped region 15 and the third P-type doped region 16, a fifth trench 19 is provided between the third P-type doped region 16 and the third N-type doped region 17, and a sixth trench 11 is provided between the third N-type doped region 17 and the fourth P-type doped region 18. All the trenches are shallow trenches.

In some embodiments, a number of diodes in the diode string 200 is greater than or equal to 0.

In some embodiments, the diode string 200 includes a fifth diode 201 and a sixth diode 202;

the positive electrode of the fifth diode 201 is the positive electrode of the diode string 200, the negative electrode of the fifth diode 201 is connected with the positive electrode of the sixth diode 202, and the negative electrode of the sixth diode 202 is the negative electrode of the diode string 200.

FIG. 2 is an equivalent circuit diagram of the bidirectional silicon controlled rectifier according to an embodiment of the present disclosure.

Accordingly, as shown in FIG. 2, the embodiments of the present disclosure also provide a diode-triggered circuit, which includes:

- a forward diode trigger circuit, the forward diode trigger circuit including a first diode 105, a diode string 200 and a second diode 106;
- a reverse diode trigger circuit, the reverse diode trigger circuit including a third diode 107, a diode string 200 and a fourth diode 108;
- a forward SCR loop, the forward SCR loop including a first PNP bipolar transistor 101 and a first NPN bipolar transistor 103; and
- a reverse SCR loop, the reverse SCR loop including a second PNP bipolar transistor 102 and a second NPN bipolar transistor 104;
- wherein the forward diode trigger circuit and the reverse diode trigger circuit share the diode string 200.

In some embodiments, the positive electrode of the first diode 105 is connected with the anode A, the negative electrode of the first diode 105 is connected with the positive electrode of the diode string 200, the negative electrode of the diode string 200 is connected with the positive electrode of the second diode 106, and the negative electrode of the second diode 106 is connected with the cathode D; the forward diode trigger circuit is from the anode A to the cathode D via the first diode 105, the diode string 200 and the second diode 106.

In some embodiments, the positive electrode of the third diode 107 is connected with the cathode D, the negative electrode of the third diode 107 is connected with the positive electrode of the diode string 200, the negative electrode of the diode string 200 is connected with the positive electrode of the fourth diode 108, and the negative electrode of the fourth diode 108 is connected with the anode A; the reverse diode trigger circuit is from the cathode D to the anode A via the third diode 107, the diode string 200 and the fourth diode 108.

In some embodiments, the base of the first PNP bipolar transistor 101 is the collector of the first NPN bipolar transistor 103, the base of the first NPN bipolar transistor 103 is the collector of the first PNP bipolar transistor 101, the base of the first PNP bipolar transistor 101 is connected with the positive electrode of the diode string 200, the collector of the first PNP bipolar transistor 101 is connected with the negative electrode of the diode string 200, the emitter of the first PNP bipolar transistor 101 is connected with the anode A, and the emitter of the first NPN bipolar transistor 103 is connected with the cathode D; the forward SCR loop is from the anode A to the cathode D via the first PNP bipolar transistor 101 and the first NPN bipolar transistor 103.

In some embodiments, the base of the second PNP bipolar transistor 102 is the collector of the second NPN bipolar transistor 104, the base of the second NPN bipolar transistor 104 is the collector of the second PNP bipolar transistor 102, the base of the second PNP bipolar transistor 102 is connected with the positive electrode of the diode string 200, the collector of the second PNP bipolar transistor 102 is connected with the negative electrode of the diode string 200, the emitter of the second NPN bipolar transistor 104 is connected with the anode A, and the emitter of the second PNP bipolar transistor 102 is connected with the cathode D; the reverse SCR loop is from the cathode D to the anode A via the second PNP bipolar transistor 102 and the second NPN bipolar transistor 104.

In some embodiments, a number of diodes in the diode string 200 is greater than or equal to 0.

In some embodiments, the diode string 200 includes a fifth diode 201 and a sixth diode 202;

the positive electrode of the fifth diode 201 is the positive electrode of the diode string 200, the negative electrode of the fifth diode 201 is connected with the positive electrode of the sixth diode 202, and the negative electrode of the sixth diode 202 is the negative electrode of the diode string 200.

The diode-triggered circuit according to the present embodiment has the same beneficial effect as the foregoing diode-triggered bidirectional silicon controlled rectifier, so no description is given here.

The ordinary skills in the art can understand that the implementations described above are particular embodiments for implementing the present disclosure. In practical uses, various changes in forms and details may be made to the implementations without departing from the spirit and scope of the present disclosure. Any skills in the art may make their own changes and modifications without departing from the spirit and scope of the present disclosure. Therefore, the protection scope of the present disclosure shall be subject to the protection scope of the claims.

What is claimed is:

1. A diode-triggered bidirectional silicon controlled rectifier, comprising a silicon controlled rectifier (SCR) and a diode string, the silicon controlled rectifier having an anode and a cathode and comprising:
   - a P-type substrate;
   - a first P well formed in the P-type substrate, a first P-type doped region and a first N-type doped region being formed in the first P well;
   - a second P well formed in the P-type substrate, a third N-type doped region and a fourth P-type doped region being formed in the second P well; and
   - an N well formed in the P-type substrate, a second P-type doped region, a second N-type doped region and a third P-type doped region being formed in the N well;
   - wherein the first N-type doped region and the third P-type doped region are electrically connected with the anode; the third N-type doped region and the second P-type doped region are electrically connected with the cathode; the second N-type doped region is electrically connected with a positive electrode of the diode string, and the first P-type doped region and the fourth P-type doped region are electrically connected with a negative electrode of the diode string.

2. The diode-triggered bidirectional silicon controlled rectifier according to claim 1, wherein the first P-type doped region, the second P-type doped region, the third P-type doped region, the fourth P-type doped region, the first N-type doped region, the second N-type doped region and the third N-type doped region are all heavily doped regions, and the first P well, the second P well and the N well are all lightly doped regions.

3. The diode-triggered bidirectional silicon controlled rectifier according to claim 1, wherein the first P well and the second P well are closely adjacent to the N well, and the first P well and the second P well are distributed symmetrically with respect to a central axis of the N well; wherein the first P-type doped region and the fourth P-type doped region are symmetrical with respect to the central axis of the N well, the first N-type doped region and the third N-type doped region are symmetrical with respect to the central axis of the N well, and the second P-type doped region and the third P-type doped region are symmetrical with respect to the central axis of the N well.

4. The diode-triggered bidirectional silicon controlled rectifier according to claim 3, wherein as seen in a direction from the first P well towards the second P well via the N well, the doped regions are the first P-type doped region, the first N-type doped region, the second P-type doped region, the second N-type doped region, the third P-type doped region, the third N-type doped region, and the fourth P-type doped region in sequence.

5. The diode-triggered bidirectional silicon controlled rectifier according to claim 1, wherein a deep N well is formed in the P-type substrate, and the first P well, the N well and the second P well are disposed on an upper surface of the deep N well.

6. The diode-triggered bidirectional silicon controlled rectifier according to claim 1, wherein shallow trench isolation structures are formed between adjacent doped regions, with depths of the doped regions being less than depths of the shallow trench isolation structures.

7. The diode-triggered bidirectional silicon controlled rectifier according to claim 1, wherein a number of diodes in the diode string is greater than or equal to 0.

8. The diode-triggered bidirectional silicon controlled rectifier according to claim 7, wherein the diode string comprises a fifth diode and a sixth diode;
a positive electrode of the fifth diode is the positive electrode of the diode string, a negative electrode of the fifth diode is connected with a positive electrode of the sixth diode, and a negative electrode of the sixth diode is the negative electrode of the diode string.

9. A diode-triggered circuit, comprising:
a forward diode trigger circuit, the forward diode trigger circuit comprising a first diode, a diode string and a second diode;
a reverse diode trigger circuit, the reverse diode trigger circuit comprising a third diode, a diode string and a fourth diode;
a forward silicon controlled rectifier (SCR) loop, the forward SCR loop comprising a first PNP bipolar transistor and a first NPN bipolar transistor; and
a reverse SCR loop, the reverse SCR loop comprising a second PNP bipolar transistor and a second NPN bipolar transistor;
wherein the forward diode trigger circuit and the reverse diode trigger circuit share the diode string.

10. The diode-triggered circuit according to claim 9, wherein
a positive electrode of the first diode is connected with an anode, a negative electrode of the first diode is connected with a positive electrode of the diode string, a negative electrode of the diode string is connected with a positive electrode of the second diode, and a negative electrode of the second diode is connected with a cathode; the forward diode trigger circuit is from the anode to the cathode via the first diode, the diode string and the second diode.

11. The diode-triggered circuit according to claim 10, wherein a number of diodes in the diode string is greater than or equal to 0.

12. The diode-triggered circuit according to claim 11, wherein the diode string comprises a fifth diode and a sixth diode;
a positive electrode of the fifth diode is the positive electrode of the diode string, a negative electrode of the fifth diode is connected with a positive electrode of the sixth diode, and a negative electrode of the sixth diode is the negative electrode of the diode string.

13. The diode-triggered circuit according to claim 9, wherein a positive electrode of the third diode is connected with a cathode, a negative electrode of the third diode is connected with a positive electrode of the diode string, a negative electrode of the diode string is connected with a positive electrode of the fourth diode, and a negative electrode of the fourth diode is connected with an anode;
the reverse diode trigger circuit is from the cathode to the anode via the third diode, the diode string and the fourth diode.

14. The diode-triggered circuit according to claim 13, wherein a number of diodes in the diode string is greater than or equal to 0.

15. The diode-triggered circuit according to claim 9, wherein
a base of the first PNP bipolar transistor is a collector of the first NPN bipolar transistor, a base of the first NPN bipolar transistor is a collector of the first PNP bipolar transistor, the base of the first PNP bipolar transistor is connected with a positive electrode of the diode string, the collector of the first PNP bipolar transistor is connected with a negative electrode of the diode string, an emitter of the first PNP bipolar transistor is connected with an anode, and an emitter of the first NPN bipolar transistor is connected with a cathode; the forward SCR loop is from the anode to the cathode via the first PNP bipolar transistor and the first NPN bipolar transistor.

16. The diode-triggered circuit according to claim 15, wherein a number of diodes in the diode string is greater than or equal to 0.

17. The diode-triggered circuit according to claim 9, wherein
a base of the second PNP bipolar transistor is a collector of the second NPN bipolar transistor, a base of the second NPN bipolar transistor is a collector of the second PNP bipolar transistor, the base of the second PNP bipolar transistor is connected with a positive electrode of the diode string, the collector of the second PNP bipolar transistor is connected with a negative electrode of the diode string, an emitter of the second NPN bipolar transistor is connected with an anode, and an emitter of the second PNP bipolar transistor is connected with a cathode; the reverse SCR loop is from the cathode to the anode via the second PNP bipolar transistor and the second NPN bipolar transistor.

18. The diode-triggered circuit according to claim 17, wherein a number of diodes in the diode string is greater than or equal to 0.

19. The diode-triggered circuit according to claim 9, wherein a number of diodes in the diode string is greater than or equal to 0.

20. The diode-triggered circuit according to 19, wherein the diode string comprises a fifth diode and a sixth diode;
a positive electrode of the fifth diode is the positive electrode of the diode string, a negative electrode of the fifth diode is connected with a positive electrode of the sixth diode, and a negative electrode of the sixth diode is the negative electrode of the diode string.

* * * * *